United States Patent
Pomeroy et al.

(10) Patent No.: US 7,914,915 B2
(45) Date of Patent: Mar. 29, 2011

(54) HIGHLY CHARGED ION MODIFIED OXIDE DEVICE AND METHOD OF MAKING SAME

(75) Inventors: Joshua M. Pomeroy, Laytonsville, MD (US); Holger Grube, Gaithersburg, MD (US); Andrew Perrella, Ithaca, NY (US); Fern Slew, legal representative, Ithaca, NY (US)

(73) Assignee: The United States of America as represented by the Secretary of the Commerce, The National Institutes of Standards and Technology, Washington, DC (US)

( * ) Notice: Subject to any disclaimer, the term of this patent is extended or adjusted under 35 U.S.C. 154(b) by 247 days.

(21) Appl. No.: 12/036,729

(22) Filed: Feb. 25, 2008

(65) Prior Publication Data

US 2008/0220279 A1    Sep. 11, 2008

Related U.S. Application Data

(60) Provisional application No. 60/905,125, filed on Mar. 6, 2007.

(51) Int. Cl.
  *G11B 5/39*    (2006.01)
  *B32B 15/04*   (2006.01)
  *B32B 3/26*    (2006.01)
  *B32B 3/30*    (2006.01)

(52) U.S. Cl. .............. 428/811.1; 428/811.5; 428/552; 428/611; 428/639; 428/640; 428/655; 428/686; 428/687; 428/131; 428/312.2; 428/312.8; 428/409; 360/324.2

(58) Field of Classification Search ............... None
See application file for complete search history.

(56) References Cited

U.S. PATENT DOCUMENTS

| | | | | |
|---|---|---|---|---|
| 5,936,402 | A  * | 8/1999  | Schep et al. | 324/252 |
| 6,828,039 | B2 * | 12/2004 | Sugawara     | 428/621 |
| 7,215,515 | B2 * | 5/2007  | Sugawara     | 360/322 |
| 2002/0054461 | A1 * | 5/2002 | Fujiwara et al. | 360/324.1 |
| 2002/0135956 | A1 * | 9/2002 | Hasegawa et al. | 360/324.12 |
| 2005/0201021 | A1 * | 9/2005 | Hosomi | 360/324.1 |
| 2008/0013222 | A1 * | 1/2008 | Okuno et al. | 360/324.1 |

OTHER PUBLICATIONS

Grube, H., Pomeroy, J., Perrella, A., and Gillaspy, J., Mater. Res. Soc. Symp. Proc 960E, 0960-N08-02, pp. 1-6, 2007.*

Pomeroy, J., Grube, H., Perrella, A., Sosolik, C., and Gillaspy, J, Nuc. Ins. Met. Phs. Res. B., 256, 319-323, 2007.*

Pomeroy, J., Grube, H., Perrella, A., and Gillaspy, J., App. Phy. Let., 91, 073506, 2007.*

Pomeroy, J., Grube, H., Perrella, A., and Gillaspy, J., Nuc. Ins. Met. Phys. Res. B., 258, 189-193, 2007.*

Grube et al., "Highly Charged Ion Modified Magnetic Tunnel Junctions," Mater. Res. Soc. Symp. Proc. 960E, Warrendale, PA, 2007, 0960-N08-02.

Gillaspy et al., "The Potential of Highly Charged Ions: Possible Future Applications," 2007, pp. 451-456, Journal of Physics: Conference Series 58.

* cited by examiner

*Primary Examiner* — Kevin M Bernatz
(74) *Attorney, Agent, or Firm* — Stites & Harbison, PLLC; Stephen J. Weyer

(57) ABSTRACT

A highly charged ion modified device is provided that includes a first metal layer or layers deposited on a substrate and an insulator layer, deposited on the first metal layer, including a plurality of holes therein produced by irradiation thereof with highly charged ions. The metal of a further metal layer, deposited on the insulator layer, fills the plurality of holes in the insulator layer.

25 Claims, 1 Drawing Sheet

HIGHLY CHARGED ION MODIFIED OXIDE DEVICE AND METHOD OF MAKING SAME

CROSS-REFERENCE TO RELATED APPLICATIONS

This application claims priority to U.S. provisional patent application No. 60/905,125, entitled HIGHLY CHARGED ION MODIFIED OXIDES (HCIMO) FOR TUNABLE RESISTANCE AND A NEW GENERATION OF MAGNETIC SENSORS, filed on Mar. 6, 2007, the disclosure of which is hereby incorporated by reference.

BACKGROUND OF THE INVENTION

1. Field of the Invention

The present invention generally relates to modified oxides, and more specifically, to a highly charged ion modified oxide device having tunable resistance, to a method of making the device, and to a specific implementation that operates as a magnetic field sensor.

2. Description of Prior Art

In any sensor device that relies on sensing changes in an electric signal, the electrical resistance of the device is of concern. In general, this concern increases as the size of the sensor is reduced. The electrical resistance of the sensor device changes as the size changes due to properties inherent in the sensor material. Thus, for such devices, there is a need to be able to control the device resistance in an effective, commercially viable manner.

Considering a specific field wherein this need is particularly acute, in magnetic multilayer systems the inability to achieve a specific device resistance can create problems. For example, there are electrical resistance problems associated with current perpendicular to the plane (CPP) magnetic sensors. State-of-the-art CPP type magnetic sensors produced by using metal-metal interfaces and metal-insulator interfaces have electrical resistances that are too low and too high, respectively, to be viable. In the former case, the resistances of the CPP sensor is much too small for use as a hard drive read head because of the metal-metal interfaces. On the other hand, in the latter case, magnetic tunnel junction (MTJ) devices have an unfavorable impedance due to a complete insulating film that is part of its design, which leads to poor bandwidth.

Considering metal-insulator-metal (MIM) devices that can operate as magnetic sensors, magnetic fields are "sensed" due to a change in the completed device's resistance that is a fraction of the "base resistance", i.e. the resistance of the device in the absence of a magnetic field. A change in the device resistance due to an external magnetic field is called "magneto-resistance" (MR). The quantitative value of the MR is typically determined by the ratio of the device resistance caused by an external field to the base resistance. For a MIM device to be technologically useful as a magnetic sensor, it must have both a desirable base resistance and also a "functional" MR. Depending on the specific technical details of the implementation, "functional" will depend on the quantitative value of the MR, as well as the linearity of the MR near zero external magnetic field and the rate of change of the MR near zero external field. As a consequence, demonstrating MR within a device that has a variable "base resistance" is highly desirable.

SUMMARY OF THE INVENTION

In accordance with the invention, there are provided a highly charged ion modified oxide device, and a method for making the device, which afford important advantages over the prior art. Among the most important of these advantages is that the electrical resistance of the device is tunable so that by selecting the appropriate electrical resistance, desired properties of the sensor can be achieved.

In accordance with one aspect of the present invention, the device includes: at least a first layer composed of at least a first metal, at least one insulator layer deposited on the at least one metal layer, and including a plurality of holes formed therein by irradiation thereof with highly charged ions, and at least one further metal layer comprised of at least a second metal deposited on the at least one insulator layer, so as to fill the plurality of holes in the at least one insulator layer.

In a preferred implementation, the at least one metal layer includes a cobalt layer, a copper layer deposited on the cobalt layer, and a further cobalt layer deposited on the copper layer.

In one important embodiment, the at least one insulator layer is completely oxidized and includes an aluminum oxide.

Preferably, the at least one further metal layer includes cobalt.

Preferably, the device further includes a copper layer deposited on the at least one further metal layer.

Preferably, the device has an electrical resistance, the electrical resistance being tunable by adjusting the number of highly charged ions. The electrical resistance is further tunable by adjusting at least one of: the insulator layer thickness, composition of the at least one insulator layer, oxidation time period in oxidizing the at least one insulation layer, and composition of the at least one further metal layer.

In accordance with another aspect of the present invention, a method of making the device includes the steps of: depositing at least one metal layer on a substrate; depositing at least one insulator layer on the at least one metal layer; irradiating the at least one insulator layer with highly charged ions to create a plurality of holes in the at least one insulator layer; and depositing at least one further metal layer over the at least one insulator layer, such that the plurality of holes are filled by the one further metal layer.

Preferably, the at least one metal layer forms a bottom lead structure, at least one associated contact, and at least a lower ferromagnetic electrode and the at least one further metal layer forms at least one further contact and at least one upper lead structure overlapping the bottom lead structure.

Preferably, the method includes the step of oxidizing the at least one insulator layer for an amount of time sufficient to completely oxidize the at least one insulator layer prior to the step of irradiating the at least one insulator layer.

In one preferred embodiment, the device has a tunable resistance, and the method further includes the step of tuning the electrical resistance by adjusting the number of the highly charged ions.

In another preferred embodiment, the device has a tunable resistance, and the method further includes the step of tuning the electrical resistance based on at least one of insulator layer thickness, type of insulator layer, oxidation time associated with oxidation of the insulator layer, and type of the at least one further metal layer.

In accordance with yet another aspect of the present invention, the device includes a substrate, at least one metal layer comprised of at least a first metal deposited on the substrate, the at least one metal layer forming a first lead structure; at least one insulator layer deposited on the at least one metal layer, the second insulator layer being completely oxidized, and including a plurality of holes formed therein by irradiation thereof with highly charged ions; and at least one further metal layer comprised of at least a second metal deposited on the at least one second insulator layer, so as to fill the plurality of holes in the insulator layer, the at least one further metal layer forming a second lead structure overlapping the first lead structure.

In one preferred implementation, the at least one metal layer includes a cobalt layer, a copper layer deposited on the cobalt layer, and a further cobalt layer deposited on the copper layer.

Preferably, the at least one insulator layer includes an aluminum oxide.

Advantageously, the at least one further metal layer includes cobalt.

Preferably, the device further includes a copper layer deposited on the at least one further metal layer.

In one important preferred embodiment, the device has an electrical resistance, the electrical resistance being tunable by adjusting the number of highly charged ions. Advantageously, the electrical resistance is further tunable by adjusting at least one of insulator layer thickness, composition of the at least one insulator layer, oxidation time period in oxidizing the at least one insulation layer, and composition of the at least one further metal layer.

In accordance with yet another aspect of the present invention, the device includes a substrate, at least one metal layer comprised of at least a ferromagnetic layer connected to a lower electrode structure, at least one insulator layer deposited on the ferromagnetic layer, the second insulator layer being completely oxidized, and including a plurality of holes formed therein by irradiation thereof with highly charged ions, and at least one further metal layer comprised of at least a second metal, the second metal comprised of at least one further ferromagnetic layer deposited on the at least one second insulator layer, so as to fill the plurality of holes in the insulator layer and connect to an upper electrode structure.

In one preferred implementation, the substrate includes an anti-ferromagnetic surface layer, the at least one metal layer includes a cobalt ferromagnetic layer, the at least one further metal layer includes an additional cobalt layer, and the at least one further metal layer comprises a copper layer deposited over the additional cobalt layer.

Preferably, the anti-ferromagnetic surface layer comprises nickel oxide or cobalt oxide.

Advantageously, the at least one metal layer comprises a cobalt oxide anti-ferromagnetic layer, and the at least one further metal layer includes an additional cobalt layer and a copper layer deposited over the additional cobalt layer.

Preferably, the at least one insulator layer comprises an aluminum oxide.

Preferably, the at least one metal layer includes a cobalt ferromagnetic layer, the at least one further metal layer includes an additional cobalt layer and an anti-ferromagnetic cobalt oxide layer deposited on the additional cobalt layer.

Advantageously, the cobalt oxide layer is formed by exposing the additional cobalt layer to an oxygen plasma.

In one important preferred embodiment, the device has an electrical resistance, the electrical resistance being tunable by adjusting the number of highly charged ions. Advantageously, the electrical resistance is further tunable by adjusting at least one of insulator layer thickness, composition of the at least one insulator layer, oxidation time period in oxidizing the at least one insulation layer, and composition of the at least one further metal layer.

Further features and advantages of the present invention will be set forth in, or apparent from, the detailed description of preferred embodiments thereof which follows.

BRIEF DESCRIPTION OF THE DRAWINGS

Exemplary embodiments of the invention will now be described, by way of example only, with reference to the accompanying drawings in which.

DESCRIPTION OF EXEMPLARY EMBODIMENTS OF THE INVENTION

Figure 1:
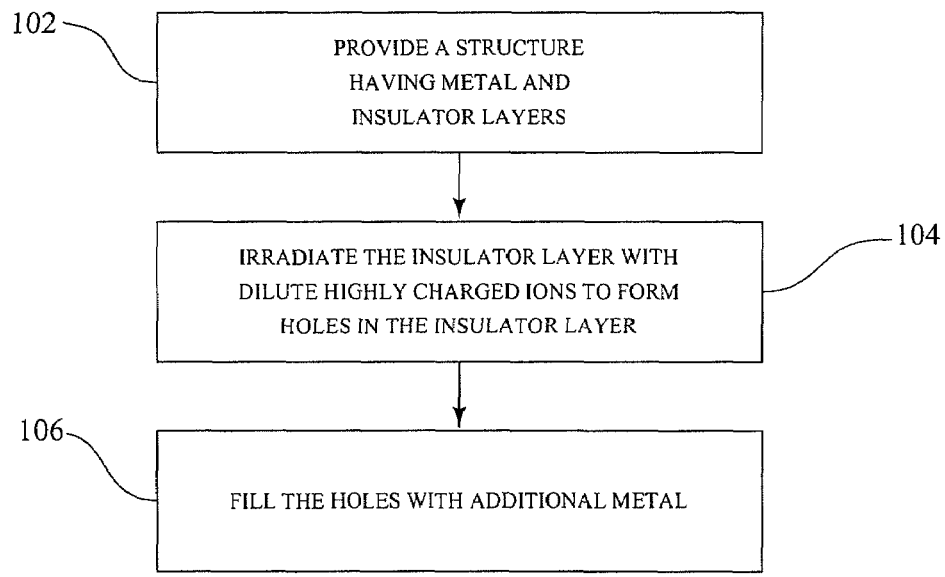
FIG. 1 is a flow chart of a method for producing a highly charged ion modified oxide device, in accordance with one aspect of the invention.

Referring to FIG. 1, there is provided a flow diagram of a method for producing an ultra-thin metal-insulator hybrid Highly Charged Ion Modified Oxide ("HCIMO") device in accordance with one aspect of the invention. The general method depicted includes the steps of: providing a structure having a metal and insulator layers, indicated by block 102, irradiating the insulator layer using dilute highly charged ions ("HCI") to make thousands of holes in the insulator, block 104, and filling in the holes with additional metal, block 106. Specific embodiments of these steps will be considered in more detail below.

Figure 2:
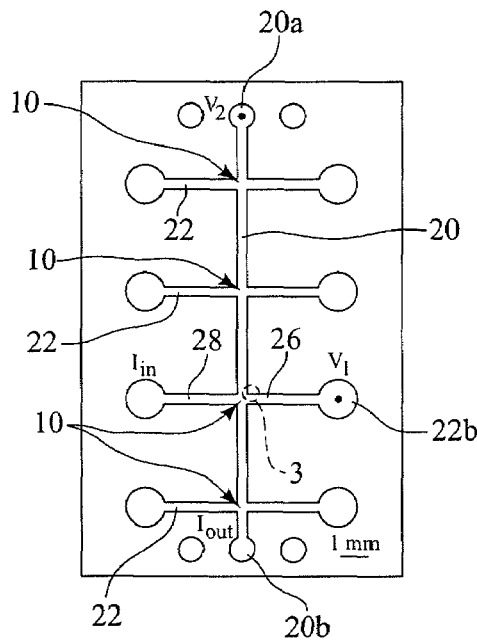
FIG. 2 is top plan view of a device according to an exemplary embodiment of the invention.
Figure 3:
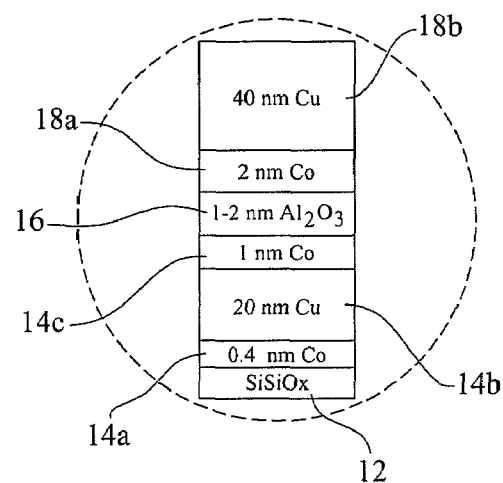
FIG. 3 is a cross-sectional view of an active area of the device of FIG. 2.

Referring to FIG. 2 and FIG. 3, there is shown a preferred embodiment of a HCIMO device in accordance with the invention. The device, which is generally denoted 10, includes a silicon chip or substrate 12, a first, metal layer or electrode 14, a second, insulator layer 16, and a third, metal layer or electrode 18. In one embodiment, the second, insulator layer 16 is formed by an aluminum layer that is oxidized to produce an aluminum oxide layer.

The second, insulator layer 16, when formed, is irradiated with highly charged ions, leaving the layer 16 with a plurality of holes. The layer 16 is then covered by the third, metal layer 18 comprised of at least a second metal.

In a preferred embodiment, the method of producing the device 10 includes mounting the silicon chip or substrate 12 on a sample platen (not shown). The mounted silicon chip or substrate 12 is then introduced into a vacuum system. The surface of the silicon chip or substrate 12 is cleaned in vacuum with a suitable oxygen plasma. The silicon chip or substrate 12 is aligned with a mask (not shown) that defines lower ferromagnetic electrodes, e.g., a narrow lead or conductor portion 20 extending from a voltage terminal, $V_2$, defined by a first terminal pad 20a, to a current output terminal, $I_{out}$, defined by a further terminal pad 20b, and a portion of the transverse leads or conductors 22 including a current input terminal, $I_{in}$, and a voltage terminal, $V_1$, defined by terminal pads 22a and 22b, respectively.

As described above, the first, metal layer or electrode 14 is comprised of at least a first metal and is deposited on the silicon chip or substrate 12, and in a specific non-limiting example, is comprised of three metal layers, a 0.4 nm thick layer of cobalt 14a, a 20 nm thick layer of copper 14b deposited on the layer of cobalt 14a, and a 1 nm thick layer of cobalt 14c deposited on the layer of copper 14b. The three layers 14a, 14b, 14c can be deposited by electron beam thermal evaporation in a cryo-and turbo-pumped ultra-high vacuum system. In a specific example, shadow masks define bottom and top electrode patterns with 50 µm and 60 µm line widths, respectively. The layer 14a which is a uniform (no mask) adhesion layer of 0.4 nm of cobalt, is deposited first. Next, layer 14b, which is a 20 nm layer of copper, is deposited through a mask to define the 50 µm wide bottom lead structure 20 and associated contact pads 20a, 20b. Layer 14c, which is a 1 nm thick uniform cobalt film, forms the lower ferromagnetic electrode and foundation for the growth of the oxide barrier.

The second, insulator layer 16, which is comprised of, in this embodiment, aluminum oxide, is initially deposited as elemental aluminum over the whole chip or substrate 12, without using a mask. Preferably, unoxidized aluminum with a thickness from 0.7 nm to 1.2 nm is deposited over the chip 12 as the basis of the insulator layer 16.

As indicated above, the silicon chip or substrate 12 is then exposed to oxygen plasma for a period of time. The time period is selected such that the plasma completely oxidizes only the aluminum, but not the cobalt layer 14c beneath. For example, an aluminum layer of 0.71 nm±0.04 nm can be exposed for approximately 6 seconds. In specific examples, aluminum films of 0.97 nm±0.05 nm thick can be oxidized for 8.0 seconds and aluminum films of 1.06 nm±0.06 nm thick for 10.5 sec. Longer oxidations times result in the loss of ferromagnetism in the underlying 1.0 nm thick cobalt film as determined by magnetic hysteresis loop traces, which indicate overoxidation. The oxidation produces an amorphous alumina material, $Al_2O_3$ or aluminum oxide, which is approximately 1.4 times thicker than the original aluminum layer.

The silicon chip or substrate 12 is then aligned with the highly charged ion (HCI) beam, comprised of, for example, $Xe^{44+}$ ions, from an electron beam ion trap using the electrodes (leads) 20, 22 as visual guides. A region 26 incorporating the intersection of leads 20, 22, referred to as the active area of the device 10, is irradiated for a predetermined amount of time. The HCI beam is tuned such that the size of the HCI beam spot is much greater than the size of the device 10, with the aim of creating a uniform ion spatial density over one entire device rather than maximizing the fluence. The HCI beam spot size is also smaller than the spacing between individual devices on a silicon chip 12 to allow for individual exposures of devices on a single chip 12. Where there are multiple devices 10 on a chip 12, one of the devices can be left undosed or non-irradiated with the HCI beam so as to provide a reference impedance for the unexposed device.

After the irradiation is complete, the silicon chip 12 is realigned with another mask that defines the complete cross leads 22 and contact pads 22a, 22b, comprised of a 2 nm thick cobalt layer 18a and a 40 nm thick copper layer 18b, forming the upper layer 18. The top leads 22 in this example are 60 μm wide.

Once the upper leads 22 are complete, the sample chip or substrate 12 is removed from the vacuum chamber. FIG. 2 actually shows the finished silicon chip 12 with four devices 10. As shown in FIG. 2 and described above, the bottom lead 20 extends vertically and is crossed by four horizontal leads 22. Two pads 22a, 22b at the opposite ends of each horizontal lead 22 allow the devices 10 to be measured with 4-point probe measurements, i.e., a constant current is introduced at current input terminal $I_{in}$ defined by pad 22a and drained at current output terminal $I_{out}$ 22b while measuring the voltage drop between voltage terminal $V_1$ defined by pad 22b and voltage terminal $V_2$ defined by pad 20a. The active area of each device 10, which is indicated at 26 in FIG. 2, is approximately 50 μm×60 μm as indicated above.

A multilayer device constructed generally as described above shows a clear and systematic decrease in the electrical resistance with increasing HCI exposure. The decrease in electrical resistance is related to irradiation with very dilute HCI doses, e.g., a dose of 1 HCI per 100 nm×100 nm area yields an electrical resistance reduction by a factor of greater than 100. The nanometer dimensions of the modified area due to an individual HCI and a precise control over the HCI dose combine to allow a high precise selection of the device resistance. The change in device resistance has been presently demonstrated at over three orders of magnitude. Since the size of the device modification is determined by the properties of a single ion, precise alignment is not required; the only requirement is the provision of uniform irradiation of the device area by the HCI dose.

The general method described above allows specific resistance values, e.g. 50 ohms, to be selected or tuned based not only on targeting the properties of the oxide, e.g., thickness of the insulation layer, composition of the insulation layer, and oxidation time period taken in oxidizing the insulation layer, but by selecting an appropriate highly charged ion dose and metal used for filling in the holes formed by the HCI. Therefore, this method of modifying an oxide using HCI provides an additional degree of freedom in addressing materials design problems by decoupling final electrical resistance from the electrical resistance of the individual source materials, thereby allowing a designer to produce a hybrid material from a superposition of multiple selected materials.

In an important realization of the general method described above, the device exhibits a magneto-resistance, typically by incorporating ferromagnetic layers and at least one anti-ferromagnetic layer into the device structure. The demonstration of magneto-resistance in devices whose base resistance is tunable by adjusting the irradiation by highly charged ions represents a fundamentally new class of magnetic sensors. Devices fabricated using both the HCI process and engineered to exhibit magneto-resistance has been presently demonstrated with magneto-resistance in excess of 20% (change in resistance divided by base resistance). HCI modified devices that exhibit magneto-resistance are further demonstrated to switch in when exposed to external magnetic fields of <0.01 Tesla.

A more generalized approach based on the above-described method, i.e., producing an ensemble of small, discrete pockets of one material within another, provides a new technical approach to solving many problems related to materials. In this regard, many hybrid combinations of many different types of materials can be made, allowing the unique properties of one material to be utilized in an application where it may otherwise not be feasible by introducing a dilute proportion of another material that mitigates the undesirable properties of the first.

In an important example, this general method process or technique can be used in the magnetic storage industry. In a specific example, two basic types of devices both suffer from the inability to achieve a specific device resistance in a magnetic multilayer system, which is a very similar problem to that addressed herein. H. Grube et al. "Highly Charged Ion Modified Magnetic Tunnel Junctions," *Mater. Res. Soc. Symp. Proc.* 960E, 0960-N08-02, 2007; see also Gillaspy et al. "The potential of highly charged ions: possible future applications," *J. Physics: Conference Series* 58:451-56 (2007), both of which are incorporated herein by reference. In one device, a current perpendicular to the plane (CPP) sensor for use as a hard drive read head, the electrical resistance is much too small (due to metal-metal interfaces). In the other device, a magnetic tunnel junction (MTJ), the impedance (electrical resistance) is unfavorable due to the complete insulating film that is part of the design. In both devices, introducing an HCIMO layer allows the device impedance or electrical resistance to be tuned into a favorable range, while retaining enough flexibility to maintain other critical device metrics. Further, as the sizes of the device scale down in the future, only the HCIMO needs to be adjusted to maintain device performance using the demonstrated dose control, rather than expensive process renovations and control circuit modifications.

The problem discussed above is a generic problem for almost any type of sensor application that relies on sensing changes in an electronic signal. As the size of the sensor is made smaller and smaller due to economic drivers, the electrical resistance of the device will keep changing due to intrinsic properties of the materials of the devices and sensors. However, with a tunable resistance layer as provided by the general method described herein, it becomes possible to compensate for these changes and maintain a constant impedance circuit element that potentially saves critical research and development time and monies.

In another important embodiment, the device 10 will exhibit a change in resistance due to a magnetic field, referred to hereinafter as magneto-resistance (MR) while still having a tunable resistance controlled by adjusting the number of highly charged ions. The MR is achieved by including at least one ferromagnetic layer (FM1) within the at least one metal layer immediately adjacent to the at least one insulator layer. Further, the MR may also be achieved by including at least one ferromagnetic layer (FM2) within the at least one further metal layer immediately adjacent to the at least one insulator layer.

Advantageously, a ferromagnetic layer will be included in both the at least one metal layer and the at least one further metal layer, arranged such that both ferromagnetic layers (FM1 and FM2) are immediately adjacent to the at least one insulator layer.

In a preferred implementation, one of the two ferromagnetic layers' (FM1 or FM2) magnetic moment will be extremely sensitive to external magnetic fields, hereafter called the "weak layer". The other ferromagnetic layer (FM2 or FM1) will be very insensitive to external magnetic fields, hereafter called the "strong layer." The strong layer is made insensitive to external magnetic fields by including at least one anti-ferromagnetic (AFM) layer immediately adjacent to the "strong" layer.

Considering an example, it will be understood that conductance is the mathematical inverse of electrical resistance, e.g. if the electrical resistance is 2 ohms, then the conductance is 0.5 Siemens. With an increasing HCI dose as described above, the conductance systematically increases, corresponding with a systematic decrease in the electrical resistance. It has been found that by the time the device has been exposed to 1 HCI per 100 nm×100 nm area, the conductance has increased by more than a factor of 100, which corresponds to a decrease in electrical resistance of more than a factor of 100.

Different aluminum thicknesses and oxidation times have been tested and similar increases in conductance, or decreases in electrical resistance, have been observed. The rate of increase in conductance also varies with other parameters, providing additional control.

It will be appreciated from the foregoing that the resultant hybrid material is a consequence of an ensemble effect of many thousands of nanometer-sized regions incorporated into a larger thin film at low density. Thus, the total number of the regions and the ensemble average properties determine the resultant properties of the hybrid material, while the exact position of the individual members is not important.

Although the invention has been described above in relation to exemplary embodiments thereof, it will be understood by those skilled in the art that variations and modifications can be effected in these exemplary embodiments without departing from the scope and spirit of the invention.

What is claimed is:

1. A highly charged ion modified device comprising:
   at least one metal layer comprised of at least a first metal;
   at least one insulator layer deposited on said at least one metal layer, said insulator layer having an active area comprising a plurality of holes formed in the insulator layer by irradiation thereof with highly charged ions; and
   at least one further metal layer comprised of at least a second metal deposited on said at least one insulator layer, so as to fill the plurality of holes in said at least one insulator layer,
   wherein the insulator layer is electrically active over the entire active area.

2. The device of claim 1, wherein said at least one metal layer comprises:
   a cobalt layer;
   a copper layer deposited on the cobalt layer; and
   a further cobalt layer deposited on the copper layer.

3. The device of claim 1, wherein said at least one insulator layer is completely oxidized.

4. The device of claim 1, wherein said at least one insulator layer comprises an aluminum oxide.

5. The device of claim 1, wherein said at least one further metal layer is comprised of cobalt.

6. The device of claim 1, further comprising a copper layer deposited on said at least one further metal layer.

7. The device of claim 1, wherein the device has a tunable resistance, tunable by adjusting the number of said highly charged ions.

8. The device of claim 7 wherein said resistance is tunable by adjusting at least one of insulator layer thickness, a composition of said at least one insulator layer, an oxidation time period taken in oxidizing said at least one insulation layer, and composition of said at least one further metal layer.

9. A highly charged ion modified oxide device comprising:
   a substrate;
   at least one metal layer comprised of at least a first metal deposited on said substrate, said at least one metal layer forming a first lead structure;
   at least one insulator layer deposited on said at least one metal layer, said at least one insulator layer being completely oxidized, said at least one insulator layer having an active area comprising a plurality of holes formed in the insulator layer by irradiation thereof with highly charged ions; and
   at least one further metal layer comprised of at least a second metal deposited on said at least one insulator layer, so as to fill the plurality of holes in said insulator layer, said at least one further metal layer forming a second lead structure overlapping said first lead structure,
   wherein the insulator layer is electrically active over the entire active area.

10. The device of claim 9, wherein said at least one metal layer comprises:
    a cobalt layer;
    a copper layer deposited on the cobalt layer; and
    a further cobalt layer deposited on the copper layer.

11. The device of claim 9, wherein said at least one insulator layer comprises an aluminum oxide.

12. The device of claim 9, wherein said at least one further metal layer is comprised of cobalt.

13. The device of claim 9, further comprising a copper layer deposited on said at least one further metal layer.

14. The device of claim 9, wherein the device has a tunable resistance, tunable by adjusting the number of highly charged ions.

15. The device of claim 9, wherein the device has a tunable resistance, tunable by adjusting at least one of the insulator layer thickness, a composition of said at least one insulator layer, an oxidation time period taken in oxidizing said at least one insulation layer, and composition of said at least a further metal.

16. A highly charged ion modified device comprising:
   a substrate;
   at least one metal layer comprised of at least a ferromagnetic layer connected to a lower electrode structure;
   at least one insulator layer deposited on said ferromagnetic layer, said at least one insulator layer being completely oxidized, said at least one insulating layer having an active area comprising a plurality of holes formed in the insulator layer by irradiation thereof with highly charged ions; and
   at least one further metal layer comprised of at least a second metal, said second metal comprised of at least one further ferromagnetic layer deposited on said at least one insulator layer, so as to fill the plurality of holes in said insulator layer and connect to an upper electrode structure,
   wherein the insulator layer is electrically active over the entire active area.

17. The device of claim 16, wherein said substrate comprises an anti-ferromagnetic surface layer;
   the at least one metal layer comprises a cobalt ferromagnetic layer;
   the at least one further metal layer comprises an additional cobalt layer; and
   the at least one further metal layer comprises a copper layer deposited over the additional cobalt layer.

18. The device of claim 17, wherein said anti-ferromagnetic surface layer comprises nickel oxide.

19. The device of claim 17, wherein said anti-ferromagnetic surface layer comprises cobalt oxide.

20. The device of claim 16, wherein the at least one metal layer comprises a cobalt oxide anti-ferromagnetic layer; and
   the at least one further metal layer includes an additional cobalt layer and a copper layer deposited over the additional cobalt layer.

21. The device of claim 16, wherein said at least one insulator layer comprises an aluminum oxide.

22. The device of claim 16, wherein the at least one metal layer includes a cobalt ferromagnetic layer;
   the at least one further metal layer includes an additional cobalt layer and an anti-ferromagnetic cobalt oxide layer adjacent the additional cobalt layer.

23. The device of claim 22, wherein the cobalt oxide layer is formed by exposing the additional cobalt layer to an oxygen plasma.

24. The device of 16, wherein the device has a tunable resistance, tunable by adjusting the number of highly charged ions.

25. The device of 16, where in the device has a tunable resistance, tunable by adjusting at least one of the insulator layer thickness, the composition of said at least one insulator layer, an oxidation time period taken in oxidizing said at least one insulator layer, and a composition of said one further metal layer.

* * * * *